(12) United States Patent
Tan et al.

(10) Patent No.: US 10,103,159 B2
(45) Date of Patent: Oct. 16, 2018

(54) VERTICAL THREE-DIMENSIONAL SEMICONDUCTOR DEVICE AND METHOD OF MAKING SAME

(71) Applicant: IMEC VZW, Leuven (BE)

(72) Inventors: Chi Lim Tan, Leuven (BE); Judit Gloria Lisoni Reyes, Oud-Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/960,191

(22) Filed: Dec. 4, 2015

(65) Prior Publication Data

US 2016/0163731 A1 Jun. 9, 2016

(30) Foreign Application Priority Data

Dec. 5, 2014 (EP) ..................................... 14196547

(51) Int. Cl.
*H01L 27/11582* (2017.01)
*H01L 29/78* (2006.01)
(Continued)

(52) U.S. Cl.
CPC .... *H01L 27/11582* (2013.01); *H01L 29/0638* (2013.01); *H01L 29/16* (2013.01);
(Continued)

(58) Field of Classification Search
CPC ............. H01L 29/7827; H01L 29/7788; H01L 27/11582
See application file for complete search history.

(56) References Cited

U.S. PATENT DOCUMENTS

2010/0155810 A1\* 6/2010 Kim ................... H01L 27/11548
257/316
2013/0178048 A1\* 7/2013 Sun ........................ H01L 21/743
438/478
(Continued)

FOREIGN PATENT DOCUMENTS

EP          2 544 239 A1    1/2013
WO    WO 2011/162725 A1   12/2011

OTHER PUBLICATIONS

Huang, F. "Resistivity Reduction Enables Tungsten Scaling" Semiconductor Int. Nov. 1, 2008 pp. 1-7 which is available online at https://www.highbeam.com/doc/1G1-188432577.html.\*
(Continued)

*Primary Examiner* — Asok K Sarkar
*Assistant Examiner* — Grant Withers
(74) *Attorney, Agent, or Firm* — Knobbe, Martens, Olson & Bear LLP

(57) ABSTRACT

The disclosed technology generally relates to semiconductor devices, and more particularly to a vertical three-dimensional semiconductor device and a method for manufacturing such a device. In one aspect, the vertical three-dimensional semiconductor device has a source layer formed over a substrate. A horizontal stack of alternating electrically isolating layers and electrically conductive gate layers are formed over the source layer, wherein one of the electrically isolating layers contacts the source layer. A vertical channel structure extends vertically through the horizontal stack of alternating layers. A drain is formed over the horizontal stack of alternating layers and over the vertical channel structure. The source layer is configured to inject charge carriers into the vertical channel structure, and the metal drain is configured to extract charge carriers from the vertical channel structure. A conductivity of the vertical (Continued)

channel structure is configured to change in response to an electrical bias applied to at least one of the electrically conductive gate layers.

18 Claims, 7 Drawing Sheets

(51) Int. Cl.
| | |
|---|---|
| H01L 29/792 | (2006.01) |
| H01L 29/06 | (2006.01) |
| H01L 29/16 | (2006.01) |
| H01L 29/161 | (2006.01) |
| H01L 29/20 | (2006.01) |
| H01L 29/22 | (2006.01) |
| H01L 29/66 | (2006.01) |

(52) U.S. Cl.
CPC ............ *H01L 29/161* (2013.01); *H01L 29/20* (2013.01); *H01L 29/22* (2013.01); *H01L 29/7828* (2013.01); *H01L 29/7831* (2013.01); *H01L 29/7926* (2013.01); *H01L 29/66666* (2013.01); *H01L 29/66833* (2013.01)

(56) References Cited

U.S. PATENT DOCUMENTS

| | | | |
|---|---|---|---|
| 2013/0234240 A1 | 9/2013 | Moon et al. | |
| 2013/0248974 A1* | 9/2013 | Alsmeier | G11C 16/04 257/321 |
| 2014/0097484 A1* | 4/2014 | Seol | H01L 29/42332 257/324 |
| 2014/0367763 A1* | 12/2014 | Yasuda | H01L 29/792 257/324 |
| 2016/0351576 A1* | 12/2016 | Yamazaki | H01L 27/1157 |

OTHER PUBLICATIONS

Sun, Y. "Demonstration of memory string with stacked junction-less SONOS realized on vertical silicon nanowire" IEDM 2011 Jan. 16, 2012 pp. 223-226.*

European Search Report dated Jun. 17, 2015 for European Application No. 14196547.5.

Gaillardon P-E et al., "Can we go towards true 3-D architectures?" 2011 48$^{th}$ ACM/EDAC/IEEE Design Automation Conference (DAC), Jun. 5-9, 2011.

Kim, Jiyoung et al., "A stacked memory device on logic 3D technology for ultra-high-density storage," Nanotechnology 22, (2011).

Lind, E. et al., "High frequency performance of vertical inAs nanowire MOSFET," 2010 International Conference on Indium Phosphade & Related Materials (IPRM), May 31-Jun. 4, 2010.

Sun, Y. et al., "Junction-Less Stackable SONOS Memory Realized on Vertical-Si-Nanowire fore 3-D Application," 3$^{rd}$ International Memory Workshop, May 22-25, 2011, p. 1-4.

Tomioka et al., "A III-V nanowire channel on silicon for high-performance vertical transistors," Nature Letters, Aug. 9, 2012, vol. 488, p. 189-193.

* cited by examiner

VERTICAL THREE-DIMENSIONAL SEMICONDUCTOR DEVICE AND METHOD OF MAKING SAME

CROSS-REFERENCE TO RELATED APPLICATIONS

This application claims foreign priority to European application EP 14196547.5 filed Dec. 5, 2014, the content of which is incorporated by reference herein in its entirety.

BACKGROUND

Field

The disclosed technology generally relates to semiconductor devices, and more particularly to a vertical three-dimensional semiconductor device and a method for manufacturing such a device.

Description of the Related Technology

Advances in semiconductor fabrication and processing technology continue to enable integrated circuits having transistor devices to have continuously shrinking feature sizes, which in turn enable an increasing density of circuitry to be packed on a chip. This increased capacity per unit area has generally decreased cost or increased functionality, such that the number of transistors in an integrated circuit roughly doubles every two years. As a result more cost effective production of electronic devices which may have increased functionality has been provided over time. In general, as the feature sizes of the transistor devices shrink, the performance of the devices the cost per unit and the switching power consumption is reduced while the speed is increased.

However, scaling of transistors becomes successively more difficult with each generation, as the dimensions of the constituent building blocks, i.e., the semiconductor structures, become smaller and smaller. Transistors with nanometer-scale features not only may require expensive fabrication techniques and processes, but the resulting small dimensions may also lead to performance trade-offs. As a result, in order to continue to scale CMOS technology in the nanometer regime, alternative device structures are sometimes employed to minimize performance trade-offs, e.g., short channel effects and leakage currents.

As an alternative to planar device structures, vertical device structures, i.e. device structures based on a current direction being normal to the plane of the substrate, can allow for efficient stacking of device elements such as transistors, resulting in an increased capacity, i.e., device density, per unit area of a lateral device footprint. Vertical device concepts further allow for increased parallelization of transistors in an integrated circuit.

With ever increasing needs for improved integrated circuits having increased transistor density, the number of transistor devices that have to be formed in the vertical stacks are increased. The scaling of the stacks, however, not only increases the demands of the manufacturing and processing of the devices but also lead to increased drive currents needed for device operation. Larger drive currents result in increased power consumption as well as the risk of damage to or failure of the devices.

Accordingly, there is a need for new vertical device concepts allowing for improved durability of the transistor devices.

SUMMARY OF CERTAIN INVENTIVE ASPECTS

It is an objective of the various embodiments described herein to provide an improvement of the above techniques and prior art.

A particular objective is to provide a vertical three-dimensional (3D), semiconductor device that allows for an increased capacity and operation speed, as well as scaling advantages.

These and other objectives and advantages that will be apparent from the following description of the embodiments are achieved by a vertical three-dimensional semiconductor device according to the independent claims. Various other embodiments are defined in the dependent claims.

Hence a vertical three-dimensional semiconductor device is provided, comprising: a source layer on a substrate; a horizontal stack of layers of a repetitive sequence on the source layer, each sequence comprising an electrically isolating layer and an electrically conductive gate layer, wherein an electrically isolating layer of the stack of layers is in contact with the source layer, a vertical channel structure extending through the horizontal stack of layers, a metal drain arranged above the horizontal stack of layers and the vertical channel structure, wherein the source layer being arranged to inject charge carriers, e.g., electrons and/or holes, into the vertical channel structure, the metal drain being arranged to extract charge carriers from the vertical channel structure, and wherein a conductivity of the vertical channel structure varies in response to an electrical bias being applied to an electrically conductive gate layer of the horizontal stack of layers.

By means of the invention it is possible to tune the resistance of the metal drain. By tuning the resistance of the metal drain, the dimensions and consequently the density of transistors may be improved. The use of a metal drain allows for a low resistance drain bringing about that the size of the transistors of the vertical three-dimensional semiconductor device may be decreased. Moreover the use of a metal drain having a relatively speaking low resistance will result in that less heat is generated during operation of the device. The fact that less heat is generated results in that more transistors may be included in the same device. This may advantageously be achieved by increasing the number of layers in the stack of the three-dimensional semiconductor device. In other words, more transistors may be stacked on top of each other and at the same time keeping the risk of overheating, damage and failure down. Also the voltage needed for operating the device may be lowered when using a metal drain.

Moreover, the threshold voltage, i.e. the voltage required to operate the device by forming a conductive channel, may be tuned by selecting the metal or metals used in the metal drain, as the threshold voltage is affected by the work function difference between the semiconductor and the metal of the metal drain of the metal or metals used in the metal drain.

It should be noted that within the context of this application the term "vertical channel structure" may be any material or structure used to form the vertical channel of the vertical three-dimensional device.

The vertical three-dimensional semiconductor device may be a junction less device, which is advantageous in that few or no depleted regions are present in the device. Moreover, the device may be made smaller resulting in that a higher transistor density may be achieved. Further, the device may become simpler to fabricate and the fabrication costs reduced.

The vertical channel structure may comprise a high mobility semiconductor material. The use of a high mobility semiconductor material brings about that internal resistance of the material used may be reduced as the charge carriers of the material exhibits an increased mobility. Hence, undesired generation of heat in the device may be counteracted. Moreover the increased mobility of the charge carriers results in that faster devices may be designed.

It should be noted that within the context of this application the term "high mobility material" may be any material having a charge carrier mobility exceeding that of silicon.

A side wall surface of the vertical channel structure may at least be partially covered with a dielectric layer. The dielectric layer may thus act as a gate oxide, separating the gate, from the source and drain of the transistors of the device, thereby counteracting undesired current leakage.

It should be noted that within the context of this application the term "side wall surface" may be any surface of the vertical channel structure being perpendicular to or substantially perpendicular to the substrate.

The dielectric layer may be formed by a plurality of layers, which is advantageous in that a more complex device may be realized. For instance, a charge trapping layer may be introduced allowing for trapping of charges within the dielectric layer. By selectively injecting charges to a charge trapping layer, a memory effect may be realized, where the presence of charges in a certain region of the charge trapping layer for instance denotes a value being stored. Moreover, the presence of charges in a certain position of the charge trapping layer may be sensed, there by reading out the state of the above memory effect of the charge trapping layer.

The high mobility semiconductor material may be selected from a group consisting of a III-V semiconductor material, a II-VI semiconductor material, a IV-IV semiconductor material, and Ge, which is advantageous in that the characteristics of the three-dimensional semiconductor device may be tuned to suit specific needs or desires.

The metal drain may comprise a transition metal and/or a noble metal, which is advantageous in that a low resistance drain may be realized.

The metal drain may comprise a metal selected from a group consisting of Cu, Al, Ti, W, Ni, Au, TiN, TaN, TaC, NbN, RuTa, Co, Ta, Mo, Pd, Pt, Ru, Ir and Ag, which is advantageous in that the properties of the metal drain may be tuned to suit specific needs or desires.

The source layer may comprise a transition metal and/or a noble metal, which is advantageous in that the properties of the source layer may be tuned.

The source layer may comprise a metal selected from a group consisting of Cu, Al, Ti, W, Ni, Au, TiN, TaN, TaC, NbN, RuTa, Co, Ta, Mo, Pd, Pt, Ru, Ir and Ag, which is advantageous in that the properties of the source layer may be tuned to suit specific needs or desires.

The gate layers of the horizontal stack may comprise a transition metal and/or a noble metal, which is advantageous in that the properties of the gate layers may be tuned.

The gate layers of the horizontal stack may comprise a metal selected from a group consisting of Cu, Al, Ti, W, Ni, Au, TiN, TaN, TaC, NbN, RuTa, Co, Ta, Mo, Pd, Pt, Ru, Ir and Ag, which is advantageous in that the properties of the gate layers may be tuned to suit specific needs or desires.

The isolating layers of the stack of layers may comprise a material selected from a group consisting of polysilicon, SiO (e.g., $SiO_2$), SiN (e.g., $Si_3N_4$), SiON, AlO (e.g., $Al_2O_3$), AN, MgO and carbides, which is advantageous in that the properties of the isolating layers may be tuned to suit specific needs or desires.

The device may be a memory device or a logical device.

According to another inventive aspect a method for manufacturing a vertical three-dimensional semiconductor device is disclosed comprising providing a semiconductor substrate; providing a sacrificial or a dummy source layer on the substrate; providing on the sacrificial source layer a horizontal stack of layers of a repetitive sequence, each sequence comprising an electrically isolating layer and an electrically sacrificial conductive gate layer, wherein an electrically isolating layer is in contact with the sacrificial source layer; providing a vertical channel structure extending through the horizontal stack of layers; providing a metal drain arranged above the horizontal stack of layers and the vertical channel structure; providing a vertical opening through the horizontal stack of layers and the sacrificial source layer, the vertical opening at a distance from the vertical channel structure; replacing the sacrificial source layer by a source layer and replacing the sacrificial conductive gate layers by conductive gate layers.

According to embodiments the sacrificial source layer and the electrically sacrificial conductive gate layers comprise a different material.

According to embodiments replacing the sacrificial source layer comprises etching the sacrificial source layer and refilling the etched source layer with the (final) source material thereby forming the source layer. According to embodiments an interfacial layer for Schottky barrier tuning may be provided at the sidewalls of the etched source layer before refilling with the (final) source material.

According to embodiments replacing the electrically sacrificial conductive gate layer comprises etching the electrically sacrificial conductive gate layer and refilling the etched electrically conductive gate layer with the (final) gate material thereby forming electrically conductive gate layer. According to embodiments an interfacial layer for Schottky barrier tuning may be provided at the sidewalls of the etched gate layer before refilling with the (final) gate material.

Further features of, and advantages with, the present invention will become apparent when studying the appended claims and the following description. The skilled person will realize that different features of the present invention may be combined to create embodiments other than those described in the following, without departing from the scope of the present invention.

BRIEF DESCRIPTION OF THE DRAWINGS

Various embodiments will now be described, by way of examples, with reference to the accompanying schematic drawings, in which

FIGS. 3-7 schematically show intermediate steps for manufacturing a vertical three-dimensional semiconductor device according to.

DETAILED DESCRIPTION OF CERTAIN ILLUSTRATIVE EMBODIMENTS

The various embodiments will now be described more fully hereinafter with reference to the accompanying drawings, in which currently preferred embodiments of the invention are shown. This invention may, however, be embodied in many different forms and should not be construed as limited to the embodiments set forth herein. These embodiments are rather provided for thoroughness and completeness, and for fully conveying the scope of the invention to the skilled person.

It will be understood that the terms "vertical" and "horizontal" are used herein refer to particular orientations as shown in the figures and these terms are not limitations to the specific embodiments described herein.

Figure 1:
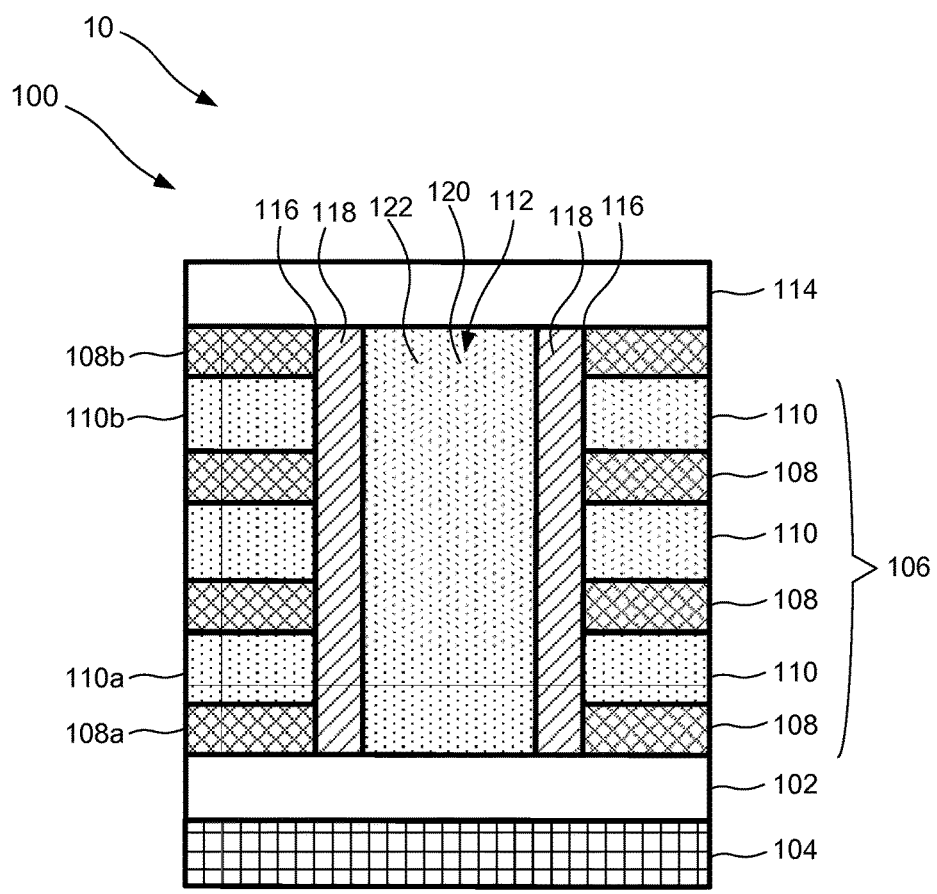
FIG. 1 is a cross sectional view of a preliminary stage of a vertical three-dimensional semiconductor device according to some embodiments.
Figure 2:
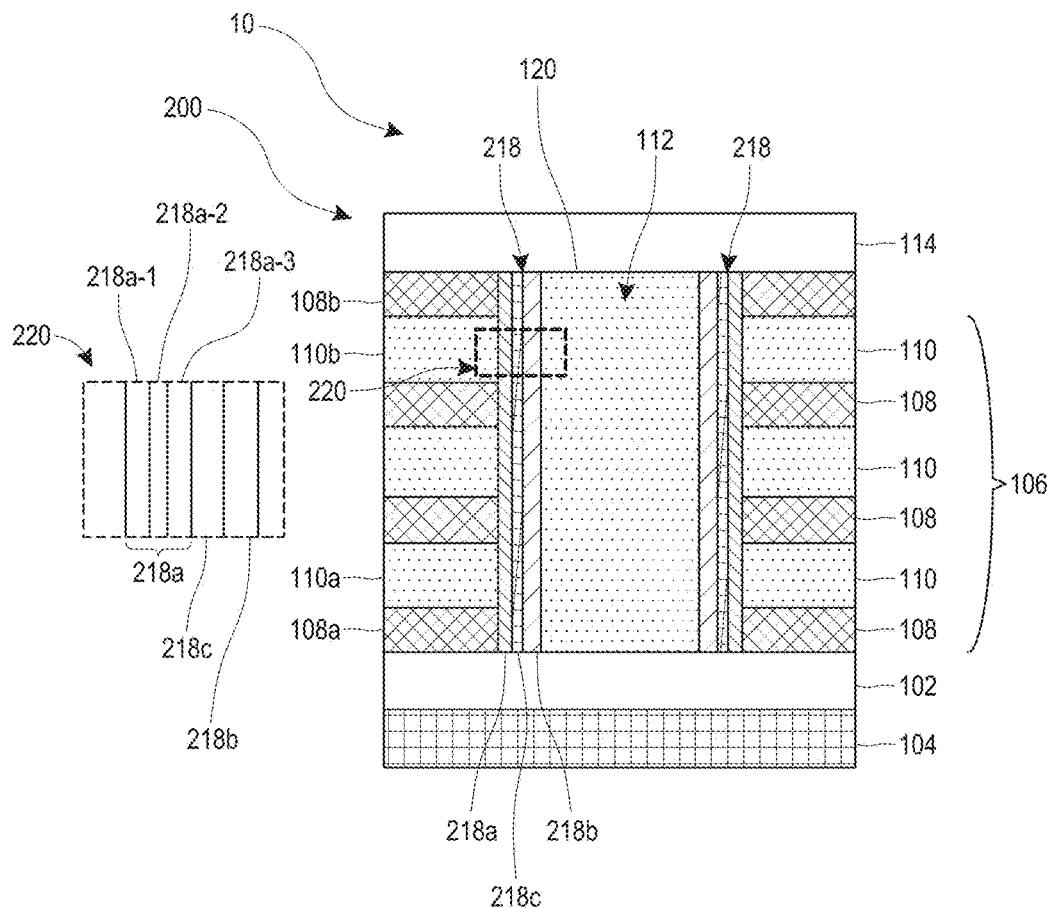
FIG. 2 is a cross sectional view of a preliminary stage of a vertical three-dimensional semiconductor device according to some other embodiments.

FIGS. 1 and 2 illustrate cross-sectional side views of intermediate structures depicting preliminary stages of fabricating vertical three-dimensional semiconductor devices 10, according to various embodiments. The vertical three-dimensional semiconductor devices 10 are junction-less devices according to embodiments, as will be described further below. According to the illustrated embodiment of FIG. 1, the vertical three-dimensional semiconductor device 10 represents an intermediate structure depicting a preliminary stage of fabricating a vertical logic device 100. The vertical logic device 100 comprises a source layer 102 on a substrate 104 and horizontal stack of layers 106 of a repetitive sequence on the source layer 102. In the illustrated embodiment, the stack of layers 106 comprises alternating electrically isolating layers 108 and electrically conductive gate layers 110. Each period of the alternating sequence of layers comprises an electrically isolating layer 108 and an electrically conductive gate layer 110. The stack of layers 106 is arranged such that an electrically isolating layer 108a of the stack of layers 106 is in contact with the source layer 102 to provide electrical isolation between the lowermost electrically conductive gate layer 110a and the source layer 102. A leakage current between the source layer 102 and the lowermost electrically conductive gate layer 110a is thereby minimized. An additional electrically isolating layer 108b is arranged on top of the topmost electrically conductive gate later 110b. The vertical logic device 100 further comprises a vertical channel structure 112 extending vertically, e.g., perpendicular to the interfaces and major surfaces of the stack of layers 106, through the horizontal stack of layers 106 and the additional electrically isolating layer 108b. A metal drain 114 is arranged above the additional electrically isolating layer 108b and the vertical channel structure 112. The additional electrically isolating layer 108b is arranged in contact with the metal drain 114 providing electrical isolation between the topmost electrically conductive gate later 110b and the metal drain 114. Leakage currents between the topmost electrically conductive gate later 110b and the metal drain 114 are thereby minimized. In some embodiments, the vertical channel structure 112 may have a vertically elongated rod or a cylindrical shape. Other arrangements are possible. For example, the vertical channel structure 112 may have a vertically elongated polygonal shape, e.g., a rectangular or a slab shape.

In the illustrated embodiment of FIG. 1, a side wall surface 116 of the vertical channel structure 112 is at least partially covered with a dielectric layer 118 such that the electrically conductive gate layers 110 of the horizontal stack of layers 106 are electrically isolated from a channel portion 120 of the vertical channel structure 112. As configured, the dielectric layer 118 is interposed between and in contact on one side with the vertical channel structure 112 and on another side with the horizontal stack of layers 106. For example, when the vertical channel structure 112 has a vertically extending rod or a cylindrical shape, the dielectric layer 118 surrounds the vertical channel structure 112, and the horizontal stack of layers 106 surrounds the dielectric layer 118.

The channel portion 120 of the vertical channel structure 112 is formed of a high mobility semiconductor material. As used herein, a high mobility semiconductor material refers a semiconductor material having electron mobility and/or hole mobility that are higher than those of silicon. In some embodiments, the high mobility semiconductor material is a III-V compound semiconductor material, a II-VI compound semiconductor material, a IV-IV compound semiconductor material or germanium (Ge).

The basic function of the vertical three-dimensional semiconductor device 10 will now be explained. The source layer 102 is arranged to inject charge carriers, e.g., electrons and/or holes, into the vertical channel structure 112, and the metal drain 114 is arranged to extract the charge carriers from the vertical channel structure 112. The conductivity of the vertical channel structure 112 varies in response to an electrical bias being applied to one or more electrically conductive gate layers 110 of the horizontal stack of layers 106. More specifically, the conductance of the channel portion 120 can be variably controlled by the electrical fields generated in the channel portion 120 by the electrical bias applied to one or more conductive gate layers 110. It will be appreciated that, in some embodiments, each of the electrically conductive gate layers 110 is configured to be independently biased with different biases, while in other embodiments, the electrically conductive gate layers 110 are configured to be collectively biased with same biases.

The functions and benefits of vertical logic devices are known to the person skilled in the art and are for example described by Jiyoung Kim et al. in "A stacked memory device on logic 3D technology for ultra-high-density data storage," as published in Nanotechnology 22 (2011).

As used herein, a junction-less device refers to a semiconductor device, e.g., a transistor, in which a semiconductor-semiconductor junction, e.g., a source/channel junction or a drain/channel junction is absent. In the context of a vertical three-dimensional semiconductor device, a junction-less device has no physical semiconductor junction along the vertical channel structure 120. In some embodiments, the vertical three-dimensional semiconductor device has no semiconductor hetero-junction, such as a PN junction (e.g., a heterojunction formed between any one of $P^+$, P or $P^-$ regions and any one of $N^+$, N or $N^-$ regions) formed between the source layer 102, the metal drain 114 and the channel portion 120. In some other embodiments, the vertical three-dimensional semiconductor device has no semiconductor homo-junction, such as a $P^+P$ junction, a $P^+P^-$ junction, a $P^-P$ junction, an $N^+N$ junction, an $N^+N-$ junction, or an $N^-N$ junction that is formed between the source layer 102, the metal drain 114 and the channel portion 120. As used herein, when the dopant concentration is of order of one dopant atom per 100 million atoms, the doping level is referred to as being low or light (e.g., $N^-$ or $P^-$), as the term is conventionally used in the industry. When more dopant atoms are added, on the order of one per ten thousand atoms, the doping level is referred to as being heavy or high (e.g., $N^+$ or $P^+$), as the term is conventionally used in the industry. A doping level between heavy and light doping concentrations is denoted without a + or a − sign, as the notation is conventionally used in the industry.

In other words, according to various embodiments, a junction-less device has a doping profile along the channel portion 120 that is substantially uniform. The junction-less device may therefore be understood as a resistor in which the mobile carrier density may be modulated by the electrically conductive gate layers. The junction-less device 10 is therefore advantageous in that few or no depleted regions are present in the device such that the device may be made smaller resulting in that a higher transistor density may be achieved. Further, the device 10 may become simpler to fabricate and the fabrication costs reduced.

The use of a high mobility semiconductor material 122 in the channel portion 120 results in that the internal resistance of the material used may further be reduced as the charge carriers of the material exhibits an increased mobility. Undesired generation of heat in the device may thus be counteracted. Moreover, the increased mobility of the charge carriers results in a faster vertical three-dimensional semiconductor device 10.

The high mobility semiconductor material 122 may be selected from a group consisting of a III-V semiconductor material, a II-VI semiconductor material, a IV-IV semiconductor material, and Ge. It is thereby possible to tune the charge carrier mobility, i.e. the resistance.

In some embodiments, the electrically conductive gate layers 110 comprise or are formed of one or more metals. Electrically conductive gate layers 110 formed of one or more metals can advantageously have lower resistance compared to, e.g., polysilicon. Moreover, metals offer near to zero electrical resistance which polysilicon doped at practical levels does not. Hence, electrically conductive gate layers 110 comprising metal are advantageous for charging and discharging the gate capacitance of the transistor such that a faster device 10 is provided.

It will be appreciated that using a metal to form the electrically conductive gate layer 110 further eliminates carrier depletion effect in the gate electrodes, which is often observed in gate electrodes formed of a semiconductor material, e.g., polysilicon. The carrier depletion effect, also referred to as the poly depletion effect and occurs when an applied electric field sweeps away carriers so as to create a region in the doped polysilicon where the non-mobile dopant atoms become ionized. The poly depletion effect reduces the strength of the expected electric field at the surface of the semiconductor when a voltage is applied to the gate electrode. The reduced electric field strength degrades the performance of the device. Hence, the use of a metal electrically conductive gate layer 110 improves the device performance by maintaining the work metal function ($O_m$) equal or at least near to the value of polysilicon gates. By further varying the metal of the metal electrically conductive gate layer 110 the threshold voltage of the vertical three-dimensional semiconductor device 10 may be tuned as it depends on the work function difference between the semiconductor and the material used as gate electrode.

Still referring to FIG. 1, the electrically conductive gate layers 110 are separated from the channel portion 120 by the dielectric layer 118. The dielectric layers 118 of FIG. 1 thereby form thin insulating layers which separate the electrically conductive gate layers 110 from the source layer 102 and the metal drain 114 as well as the channel portion 120 that connects the source layer 102 and the metal drain 114 of the vertical three-dimensional semiconductor device 10. The dielectric layers 118 thereby reduces charge current leakage from the electrically conductive gate layers 110 which for example improves the capability of the gate layers 110 to modulate the conductance of the conductive channel portion 120 of the vertical channel structure 112. The power consumption of the vertical three-dimensional semiconductor device 10 may thus be further reduced.

The vertical three-dimensional semiconductor device 10 may be seen as a junction-less device where a conductive channel is provided in the channel portion 120 when an applied bias creates a depletion region in the channel portion 120. The vertical three-dimensional semiconductor device 10 may consequently be referred to as a junction-less device 10 comprising metal-insulator-semiconductor field-effect transistors (MISFETs).

According to other embodiments, the vertical three-dimensional semiconductor device 10 may be referred to as a junction-less device 10 comprising insulated-gate field effect transistors or metal-oxide-semiconductor field-effect transistors (MOSFETs).

The electrically isolating layers 108 of the stack of layers 106 may comprise a material selected from a group consisting of polysilicon, SiO, SiN, SiON, $Al_2O_3$, AN, MgO and carbides. Further, the skilled person realizes that different materials or material combinations may be used for the isolating layers 108 of the stack of layers 106. As discussed above the conductivity of the channel portion 120 may be modulated by an applied electric field. The vertical three-dimensional semiconductor device 10 may thereby be turned into a ON state by applying an appropriate voltage to at least one electrically conductive gate layer 110 such that a conductive channel is provided which connects the source layer 102 and the metal drain 114 allowing a current to flow between the source layer 102 and the metal drain 114. Under some circumstances, once the vertical three-dimensional semiconductor device 10 is turned on, the current and the voltage have a nearly linear relationship meaning that the vertical channel structure 120 behaves like a resistor. For operation it is desirable to have a low metal drain 114 to source layer 102 resistance $R_{DS}(on)$ while the device is on. This may be achieved for example by reducing the length of the vertical channel structure 120 such that the actual length of current path is reduced. Also the use of low resistance materials in the source layer 102 and the metal drain 114 will help in reducing the value of $R_{DS}(on)$, as will be discussed in more detail below.

The metal drain 114 is provided as disclosed above, to further reduce the resistance of the vertical three-dimensional semiconductor device 10.

The use of a metal drain 114 is advantageous as it is possible to provide a drain which has lower resistance as compared to a semiconductor material. It is further possible to tune the resistance of the metal drain by using different metals for forming the metal drain. By tuning the resistance of the metal drain 114, the value of $R_{DS}(on)$ may be reduced. It is thereby possible to improve the length of the vertical channel structure 120 such that a larger number of elements, i.e. electrically conductive gate layers 110 may comprised within the vertical three-dimensional semiconductor device 10. In other words, the use of a metal drain 114 allows for a longer vertical channel structure 120 and consequently a longer current path. The use of a metal drain 114 having a relatively speaking low resistance will, moreover, result in that less heat is generated during operation. The fact that less heat is generated results in that more transistors may be included in the same device. This may advantageously be achieved by increasing the number of layers in the stack of the three-dimensional semiconductor device.

Moreover, the threshold voltage, i.e. the voltage required to operate the device by forming a conductive channel, may be tuned by selecting the metal or metals used in the metal drain 114. This because the threshold voltage is affected by the resistance and work function of the metal or metals used in the metal drain 114.

In some embodiments, to further improve the resistance of the vertical three-dimensional semiconductor device 10, the source layer 102 is formed of a material comprising a metal.

Figure 3:
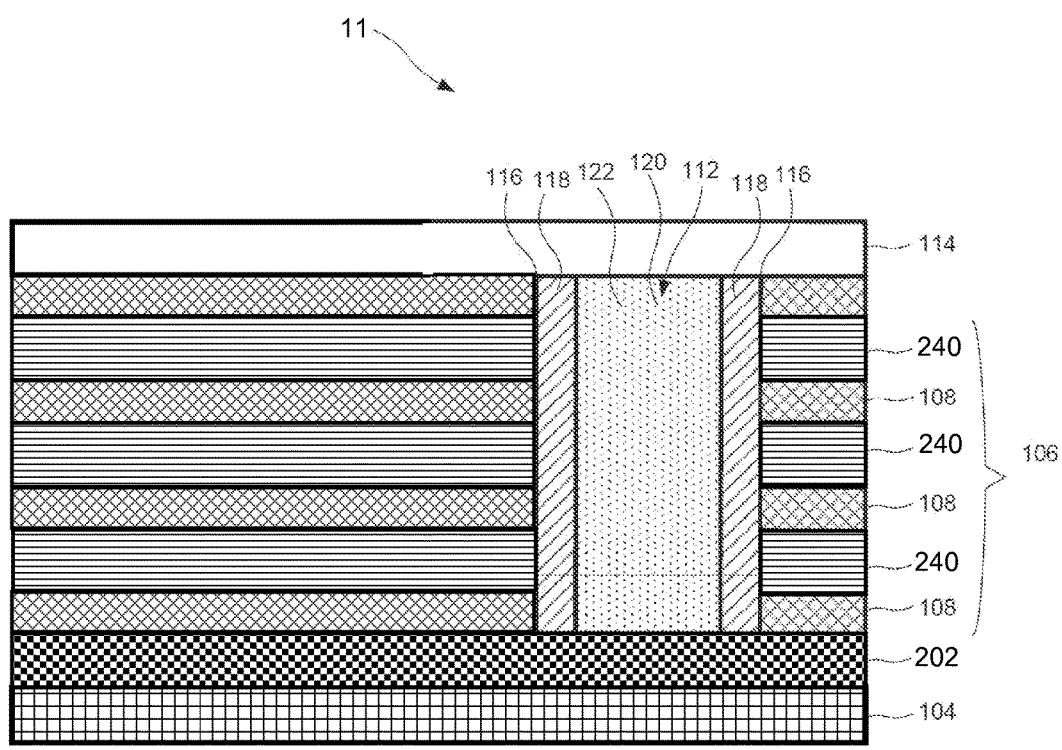

Referring to FIGS. 3-7, a method of fabricating the vertical three-dimensional semiconductor device 10 comprising a metal drain source layer 102 is described herein, according to embodiments. Referring to FIG. 3, the method comprises providing a sacrificial source layer 202 on the substrate 104. In further processing steps, the sacrificial source layer 202 is later replaced by the (final) source layer 102. The sacrificial source layer 202 preferably comprises a material which can be easily selectively removed without affecting the other layer (i.e. the stack of layers, the materials in the vertical channel structure). The sacrificial source layer 202 comprises a material which is different than the material of the sacrificial conductive gate layers 240 according to embodiments, because replacing the sacrificial source layer 202 with the (final) source layer 102 and replacing the sacrificial conductive gate layers 240 with the (final) electrically conductive gate layers 110 are separate process steps. Therefore, an etch selectivity between the sacrificial source layer 202 and the sacrificial conductive gate layers is advantageous. The sacrificial source layer 202 may, for example, comprise silicon, whereas the electrically sacrificial conductive gate layers 240 may, for example, comprise a nitride, such a silicon nitride.

Referring to FIG. 3, according to embodiments, after forming the sacrificial source layer 202 on the substrate 104, forming the horizontal stack of layers 106 comprising the alternating electrically isolating layers 108 and sacrificial conductive gate layers 240 on the sacrificial source layer 202, and forming the vertical channel structure 112, the method further continues with replacement processes for the sacrificial source layer 202 and the electrically sacrificial conductive gate layers 240, as described below with respect to FIGS. 4-7.

Figure 4:
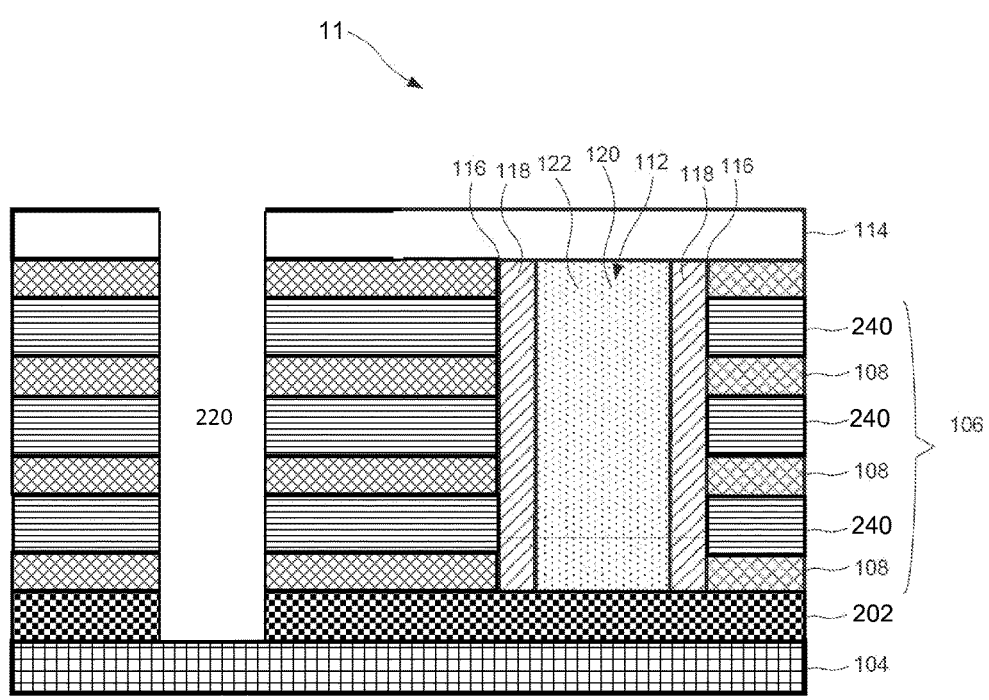

Referring to FIG. 4, according to embodiments, replacement of the sacrificial source layer 202 is performed by first providing a vertical opening 220 through the horizontal stack of layers 106 and through the sacrificial source layer 202. While the vertical opening 220 and the vertical channel structure 112 may vertically extend generally in the same vertical direction, the vertical opening 220 may be separated from the vertical channel structure 112 by a lateral distance, as illustrated in FIG. 4. Providing the vertical opening 220 through the horizontal stack of layers 106 and the sacrificial source layer 202 may be performed, e.g., using patterning and etch techniques. By providing a vertical opening 220, the sacrificial source layer 202 may be accessed by an etchant for its etch removal.

Figure 5:
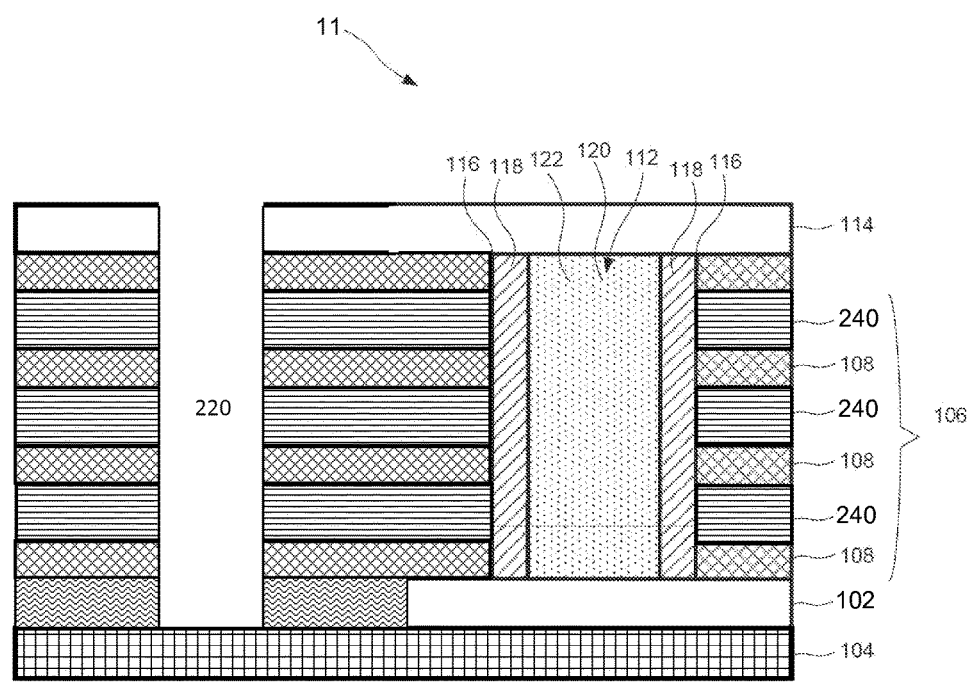

Referring to FIG. 5, according to embodiments, after providing the vertical opening 220, the sacrificial source layer 202 is replaced at least partially with the source layer 102 by selectively etching the sacrificial source layer 202 (for example using Tetramethylammonium hydroxide (TMAH) etch for removing a Si-based sacrificial source layer) and thereafter filling the etched layer with the source layer 202 material, e.g., a metal according to some embodiments. According to some embodiments, before filling the etched layer with the source layer 202 material, an interfacial layer (not shown) may be provided at the sidewalls of the etched layer for Schottky barrier height tuning. After replacing the sacrificial source layer 202 with the source layer 102, a remaining part of the source layer may be filled with an oxide in order to seal the metal source layer 102.

Figure 6:
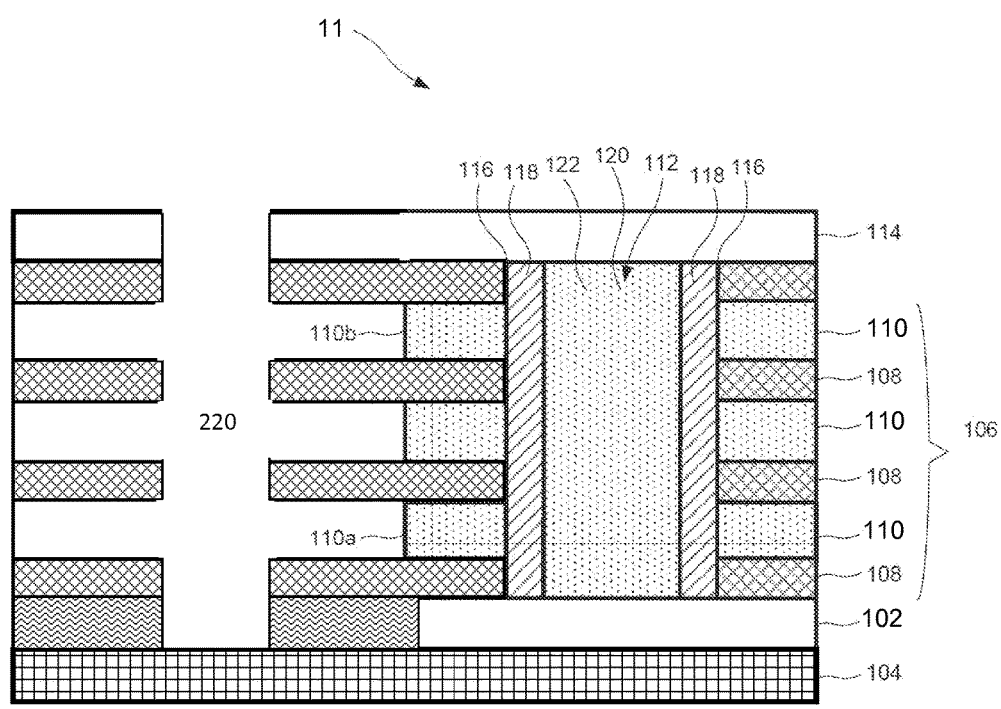

Referring to FIG. 6, according to embodiments, after at least partially replacing the sacrificial source layer 202, using the same vertical opening 202, the sacrificial conductive gate layers 240 may be replaced with the electrically conductive gate layers 110 (110a, 110b). In some embodiments, nitride sacrificial gates 240 may be removed using wet etching (e.g., using $H_3PO_4$).

Figure 7:
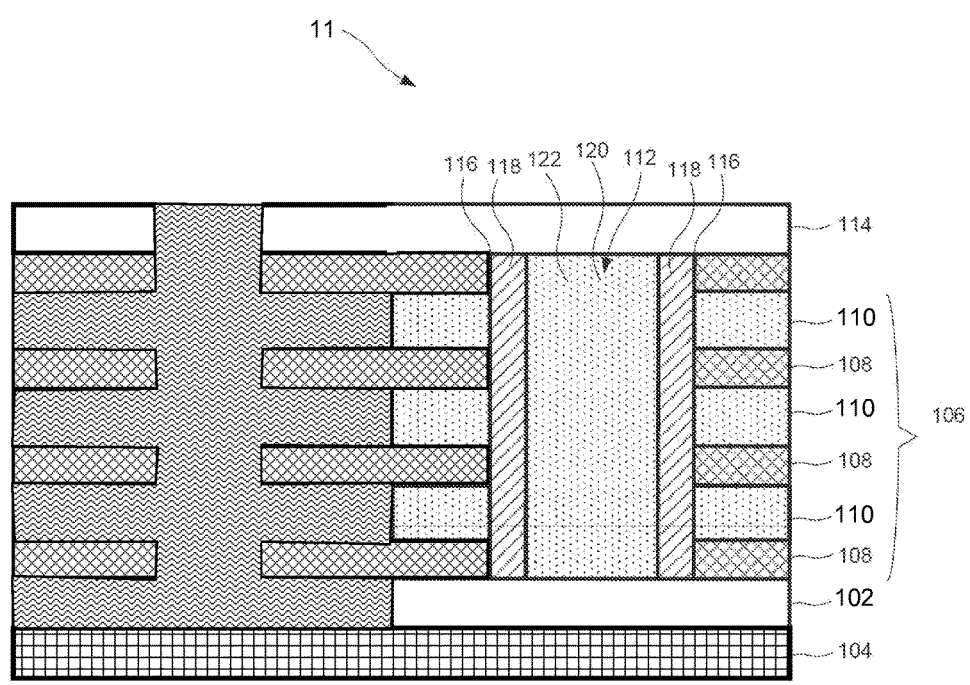

Referring to FIG. 7, according to embodiments, after replacing the sacrificial conductive gate layers 240 with electrically conductive gate layers 110, the etched gate layers may be refilled with the final (metal) gate layers. In some embodiments, interfacial layers may first be provided along the sidewalls of the etched gate layers for Schottky barrier height tuning. After replacing the sacrificial source layer and sacrificial gate layers, the remaining vertical opening is filled with a dielectric material such as an oxide.

The metal drain 114 and the metal source layer 102 may comprise a transition metal and/or a noble metal, which is advantageous in that low resistance may be realized.

The metal drain 114 and the metal source layer 102 may comprise a metal selected from a group consisting of Cu, Al, Ti, W, Ni, Au, TiN, TaN, TaC, NbN, RuTa, Co, Ta, Mo, Pd, Pt, Ru, Ir and Ag, which is advantageous in that the properties of the metal drain 114 and the metal source layer 102 may be tuned to suit specific needs or desires.

The metal drain 114 and the metal source layer 102 may comprise several layers of metals.

The metal drain 114 and the metal source layer 102 may be made of a single metal.

The metals used for forming the metal drain 114 and the metal source layer 102 may be the same or differ.

To this end, the electrically conductive gate layers 110 may comprise a metal chosen from the groups described above in relation to the metal drain 114 and the metal source layer 102. Further, the skilled person realizes that different materials or material combinations may be used for the electrically conductive gate layers 110.

The metals so described may comprise layers of metals which may improve the strain capacity and enables less current perturbations in the gate layer thanks to the disposition of electrons inside the metal.

The substrate 104 is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate 104 may include for example, an insulating layer such as a $SiO_2$ or a $Si_3N_4$ layer in addition to a semiconductor substrate portion. Thus, the term substrate 104 also includes silicon-on-glass, silicon-on-sapphire substrates. Also, the substrate 104 may be any other base on which a layer is formed, for example a glass or metal layer. Accordingly, a substrate 104 may be a wafer such as a blanket wafer or may be a layer applied to another base material, e.g. an epitaxial layer grown onto a lower layer.

In order to fabricate the vertical channel structure 112 a vertical opening (not shown) may be formed through the horizontal stack of layers 106, and the additional electrically isolating layer 108b. The vertical opening may be a hole or a trench extending through the stack of layers 106. The formation of the vertical opening may be achieved using standard process techniques known to a person skilled in the art.

The stack of layers 106 may be formed using standard deposition techniques known to a person skilled in the art, such as, for example, atomic layer deposition (ALD), physical vapor deposition (PVD), chemical vapor phase deposition (CVD), more preferably, low pressure CVD (LPCVD) or alternatively plasma enhanced CVD (PECVD).

In order to manufacture the vertical three-dimensional semiconductor device according to embodiments of certain inventive aspects, the stack of layers may first be formed by a repetitive sequence of layers wherein each sequence comprises an electrically isolating layer 108 and an electrically sacrificial conductive gate layer 240 (FIG. 3). The electrically sacrificial conductive gate layer 240 preferably comprises a material which may be removed easily in further processing steps, i.e. to replace the sacrificial conductive gate layer 240 into the final electrically conductive gate layer 110. The sacrificial conductive gate layers 240 may for example comprise nitride.

The metal comprising layers described may be deposited in a number of ways depending on the choice for instance, metal-evaporation, sputtering, chemical vapor deposition (CVD), atomic layer deposition (ALD) etc. may be used.

The channel portion 120 may be formed by chemical vapor deposition (CVD), or more preferably, low pressure chemical vapor deposition (LPCVD). Alternatively, the channel portion 120 may be provided into the hole by selective epitaxial growth, using techniques such as molecular beam epitaxy (MBE) or metallo-organic chemical vapor deposition (MOCVD).

It should further be noted that the use of metals instead of semiconductors when providing the metal drain 114 and also the metal source layer 102 and/or the metal electrically conductive gate layers 110 reduces the thermal budget for producing the vertical three-dimensional semiconductor device 10. The lower thermal budget, for example, reduces problems associated with diffusion of atoms and/or strain caused by different material having different thermal properties. Hence an improved vertical three-dimensional semiconductor device 10 is provided.

Referring back to FIG. 2, a cross-sectional side view of a preliminary stage of a vertical three-dimensional semiconductor device 10 according to another embodiment is illustrated. The device 10 can be configured as a memory device, according to some embodiments. The vertical three-dimensional semiconductor device 10 forms a preliminary stage of a vertical memory device 200. The vertical three-dimensional semiconductor device 10 is a junction-less devices as described above. Some features of the vertical device 200, configured as a memory device, are the same as those of the vertical device 100, configured as a logic device, and reference is made to the above described features, in which like numerals indicate corresponding features.

In contrast to the device 100 of FIG. 1, however, in the device 200 of FIG. 2, the dielectric layer 218 is formed of a plurality of layers 218a, 218b and 218c. To provide a memory function the plurality of layers 218a, 218b and 218c are arranged to form 1) an interpoly dielectric, IPD, or intergate dielectric IGD, also referred to as a charge blocking layer 218a, 2) a charge tunneling layer 218b, and 3) a charge storage layer 218c in between the layers 218a and 218b, respectively.

The charge blocking layer 218a provides retention of charges in the charge storage layer 218c. The charge blocking layer 218a also facilitates capacitive coupling between an electrically conductive gate layer 110 and the charge storage layer 218c which allows for read out or programming of charge states.

The name charge tunneling layer originates from the fact that the erase operation and in some cases, the programming operation, occurs through this dielectric layer 218b using quantum mechanical tunneling.

In between the layers 218a and 218b portions of the charge storage layer 218c will constitute a memory element of the vertical memory device 200.

Hence, the charge storage layer 218c is introduced to allow for storage/trapping of charges within the dielectric layer 218. By selectively injecting charges to a charge storage layer 218c, a memory effect may be realized, where the presence of charges in a certain region of the charge storage layer 218c for instance denotes a value being stored. Moreover, the presence of charges in a certain position of the storage layer may be sensed, there by reading out the state of the above memory effect of the charge storage layer 218c.

In a later state of the vertical memory device (not shown) the charge storage layer may be patterned such that isolated memory cell units are formed, at locations corresponding to interfaces of the vertical channel structure 112 with electrically conductive gate layers 110 Charges stored in the charge storage layer 218c may thereby provide a non-volatile memory function of the vertical memory device 200.

In its simplest form, the stack of layers 106 may only comprise three-electrically conducting gate layers 110 where the lowermost electrically conductive gate layer 110a forms a lower select gate, the uppermost electrically conductive gate layer 110b forms an upper select gate, and a middle conductive layer 110 forms a control gate. For a higher density of the vertical memory device, the stack of layers 106 preferably comprises between about 8 up to 64, or even more electrically conducting gate layers 110.

The formation of the electrically conductive gate layers 110 may comprise processing steps commonly referred to as replacement metal gate, RMG, processing. RMG broadens the range of material options for work-function tuning and reliability control. Further advantages are a lower gate resistance and a tool for providing mobility improvement.

Through the use of electrically conductive gate layers 110 of metals a control gate structure is formed for controlling the conductance of the channel portion 120. The metals further allows for a reduced resistivity of the control gate structure which improves the speed at which a vertical memory device 200 may be controlled.

In various embodiments, the charge storage layer 218c may be formed of a semiconductor layer, a metal layer or a dielectric layer. In some embodiments, the charge storage layer 218c may be a stack of materials including one or more of semiconductor layer(s), metal layer(s) and dielectric layer(s).

The use of a metal also here offers the possibility to tailor the band diagram for the vertical memory device. The metal comprising layers may be deposited in a number of ways depending on the choice of such as metal—evaporation, sputtering, chemical vapor deposition (CVD), atomic layer deposition (ALD) etc.

The charge blocking layer 218a may comprise a stack of a nitride containing dielectric layer 218a-2 sandwiched in between two oxygen containing dielectric layers 218a-1, 218a-3, as illustrated in a portion 220 of the plurality of layers 218a, 218b and 218c (FIG. 2). For example, a stack of $Si_3N_4$ layer sandwiched between two $SiO_2$ layers. Such a stack is often referred to as a ONO or oxide/nitride/oxide stack.

The function and benefits of the metal drain 114 and other material choices describe above in relation to the vertical logic device 100 also, when applicable apply to the vertical memory device 200. In order to avoid undue repetition, reference is made to the above.

For a vertical three-dimensional semiconductor device 10 the threshold voltage is commonly defied as the minimum voltage differential that is needed to create a conducting path between the source and drain, i.e. to provide a current flow through the channel portion 120. By selecting a metal drain 114 formed of or comprising a metal from the above disclosed groups of metals efficient tuning of the work function is obtained such that improved band alignment for the materials used in the dielectric layer and the channel portion 120 is obtained. As a result the threshold voltage is reduced. Hence, an improved power efficiency of the vertical three-dimensional semiconductor device 10 is obtained. By further providing electrically conductive gate layers 110 and/or a metal source layer 102 the power efficiency of the vertical three-dimensional semiconductor device is improved further.

The person skilled in the art realizes that the present invention by no means is limited to the preferred embodiments described above. On the contrary, many modifications and variations are possible within the scope of the appended claims.

The source layer 102 may be of a semiconductor material or comprise a semiconductor material.

The channel portion 120 may comprise a semiconductor material or a mixture of semiconductor and dielectric materials.

The semiconductor material of the channel portion 120 may comprise silicon.

Moreover, the channel portion 120 may comprise an additional layer a so-called semiconductor channel liner, not shown, the semiconductor channel liner enclosing or partially enclosing the semiconductor materials or dielectric materials of the channel portion 120. Such an arrangement may be referred to as a Macaroni-type structure.

The electrically conductive gate layers 110 may comprise highly doped polysilicon.

The vertical channel structure 112 may be partially covered with a dielectric layer such that at least the electrically conductive gate layers 110 of the horizontal stack of layers 106 are electrically isolated from an electrically conductive portion of the vertical channel structure 112.

The dielectric layer 118, 218, the charge blocking layer 218a and/or the charge tunneling layer 218b may comprise a high-k dielectric layer such as $Al_2O_3$, HfAlO or $HfO_2$, or combinations of high-k (having, e.g., k>3.9) and low-k (having, e.g., k<3.9) materials.

The dielectric layer 118, 218, the charge blocking layer 218a and/or the charge tunneling layer 218b may comprise a $SiO_2$.

The vertical logic device 100 may be used to form stacked logic structures such as NOR, NAND and inverted logic gates.

Additionally, variations to the disclosed embodiments can be understood and effected by the skilled person in practicing the claimed invention, from a study of the drawings, the disclosure, and the appended claims. The word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A vertical three-dimensional semiconductor device, comprising:
    a source layer formed of a metal extending laterally in a horizontal direction over a substrate;
    a horizontal stack of alternating electrically isolating layers and electrically conductive gate layers formed over and above the source layer and stacked in a vertical direction crossing the horizontal direction, wherein one of the electrically isolating layers closest to the substrate contacts the source layer;
    a vertical channel structure extending vertically through the horizontal stack of alternating layers and having a first end directly contacting the source layer; and
    a metal drain formed over the horizontal stack of alternating layers and contacting the vertical channel structure at a second end of the vertical channel structure, wherein the metal drain contacts a top surface of the vertical channel structure and laterally extends outside the top surface of the vertical channel structure to contact a top surface of one of the electrically isolating layers,
    wherein the source layer is configured to inject charge carriers into the vertical channel structure, wherein the metal drain is configured to extract charge carriers from the vertical channel structure, and
    wherein the conductivity of the vertical channel structure is configured to change in response to an electrical bias applied to at least one of the electrically conductive gate layers.

2. The vertical three-dimensional semiconductor device according to claim 1, wherein the vertical three dimensional semiconductor device is a junction-less device in which a semiconductor-semiconductor junction is absent.

3. The vertical three-dimensional semiconductor device according to claim 1, wherein the vertical channel structure comprises a high mobility semiconductor material.

4. The vertical three-dimensional semiconductor device according to claim 3, wherein the high mobility semiconductor material is selected from the group consisting of a III-V compound semiconductor material, a II-VI compound semiconductor material, a IV-TV compound semiconductor material and germanium (Ge).

5. The vertical three-dimensional semiconductor device according to claim 1, wherein a dielectric material at least partially covers a side wall of the vertical channel structure.

6. The vertical three-dimensional semiconductor device according to claim 5, wherein the dielectric material comprises a plurality of different dielectric layers.

7. The vertical three-dimensional semiconductor device of claim 1, wherein the metal drain is formed of a transition metal and/or a noble metal.

8. The vertical three-dimensional semiconductor device of claim 7, wherein the metal drain is formed of a metal selected from the group consisting of Cu, Al, Ti, W, Ni, Au, TiN, TaN, TaC, NbN, RuTa, Co, Ta, Mo, Pd, Pt, Ru, Ir and Ag.

9. The vertical three-dimensional semiconductor device of claim 1, wherein the source layer is formed of a transition metal and/or a noble metal.

10. The vertical three-dimensional semiconductor device of claim 9, wherein the source layer is formed of a metal selected from the group consisting of Cu, Al, Ti, W, Ni, Au, TiN, TaN, TaC, NbN, RuTa, Co, Ta, Mo, Pd, Pt, Ru, Ir and Ag.

11. The vertical three-dimensional semiconductor device of claim 1, wherein each of the electrically conductive gate layers is formed of a transition metal and/or a noble metal.

12. The vertical three-dimensional semiconductor device of claim 11, wherein each of the electrically conductive gate layers is formed of a metal selected from a group consisting of Cu, Al, Ti, W, Ni, Au, TiN, TaN, TaC, NbN, RuTa, Co, Ta, Mo, Pd, Pt, Ru, Ir and Ag.

13. The vertical three-dimensional semiconductor device of claim 1, wherein each of the electrically isolating layers is formed of an electrically insulating material selected from the group consisting of polysilicon, SiO, SiN, SiON, Al$_2$O$_3$, AN, MgO and carbides.

14. The vertical three-dimensional semiconductor device of claim 1, wherein the vertical three-dimensional semiconductor device is configured as a logic device.

15. The vertical three-dimensional semiconductor device of claim 1, wherein the vertical three-dimensional semiconductor device is configured as a memory device, wherein a dielectric material comprising a plurality of dielectric layers at least partially covers a side wall of the vertical channel structure.

16. The vertical three-dimensional semiconductor device of claim 15, wherein the dielectric material comprises a tunneling layer surrounding the vertical channel structure, a charge storage layer surrounding the tunneling layer and a charge blocking layer surrounding the charge storage layer.

17. The vertical three-dimensional semiconductor device of claim 16, wherein the charge blocking layer includes a stack of layers including a nitride layer interposed between two oxide layers.

18. The vertical three-dimensional semiconductor device of claim 16, wherein the dielectric material comprises a high-K dielectric material.

* * * * *

UNITED STATES PATENT AND TRADEMARK OFFICE
CERTIFICATE OF CORRECTION

PATENT NO. : 10,103,159 B2
APPLICATION NO. : 14/960191
DATED : October 16, 2018
INVENTOR(S) : Chi Lim Tan et al.

It is certified that error appears in the above-identified patent and that said Letters Patent is hereby corrected as shown below:

In the Specification

Column 4, Line 2, change "AN," to --AlN,--.

Column 6, Line 51, change "N+N–" to --N+N- --.

Column 6, Line 60, change "Pt)," to --P+),--.

Column 7, Line 46, change "(Om)" to --(ΦM)--.

Column 8, Line 16, change "AN," to --AlN,--.

In the Claims

Column 15, Line 3, in Claim 13, change "AN," to --AlN,--.

Signed and Sealed this
Fourteenth Day of May, 2019

Andrei Iancu
*Director of the United States Patent and Trademark Office*